United States Patent
Yang et al.

(10) Patent No.: US 8,921,941 B2
(45) Date of Patent: Dec. 30, 2014

(54) ESD PROTECTION DEVICE AND METHOD FOR FABRICATING THE SAME

(75) Inventors: Ming-Tzong Yang, Hsinchu County (TW); Ming-Cheng Lee, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 503 days.

(21) Appl. No.: 13/103,112

(22) Filed: May 9, 2011

(65) Prior Publication Data

US 2012/0032254 A1 Feb. 9, 2012

Related U.S. Application Data (60) Provisional application No. 61/371,001, filed on Aug. 5, 2010.

(51) Int. Cl.
| | | |
|---|---|---|
| H01L 23/62 | (2006.01) | |
| H01L 21/8238 | (2006.01) | |
| H01L 29/66 | (2006.01) | |
| H01L 29/78 | (2006.01) | |
| H01L 29/10 | (2006.01) | |
| H01L 21/8234 | (2006.01) | |
| H01L 29/786 | (2006.01) | |
| H01L 27/02 | (2006.01) | |
| H01L 21/265 | (2006.01) | |
| H01L 29/06 | (2006.01) | |
| H01L 29/08 | (2006.01) | |

(52) U.S. Cl.
CPC .. *H01L 29/66477* (2013.01); *H01L 21/823814* (2013.01); *H01L 29/7833* (2013.01); *H01L 29/1083* (2013.01); *H01L 29/0653* (2013.01); *H01L 21/823418* (2013.01); *H01L 29/78612* (2013.01); *H01L 29/7835* (2013.01); *H01L 27/027* (2013.01); *H01L 21/265* (2013.01); *H01L 29/0847* (2013.01)
USPC .......................................... 257/355; 257/356

(58) Field of Classification Search
USPC ................................................. 257/355, 356
See application file for complete search history.

(56) References Cited

U.S. PATENT DOCUMENTS

| | | | |
|---|---|---|---|
| 7,326,998 B1 | 2/2008 | O et al. | |
| 2005/0227440 A1* | 10/2005 | Ema et al. | 438/275 |
| 2010/0213542 A1* | 8/2010 | Chu et al. | 257/335 |

FOREIGN PATENT DOCUMENTS

| | | |
|---|---|---|
| CN | 1377087 A | 10/2002 |
| CN | 1481022 A | 3/2004 |
| CN | 1153290 C | 6/2004 |
| CN | 1278417 C | 10/2006 |

* cited by examiner

*Primary Examiner* — Jae Lee
(74) *Attorney, Agent, or Firm* — Winston Hsu; Scott Margo (57) ABSTRACT

An electrostatic discharge (ESD) protection device includes a substrate; a source region of a first conductivity type in the substrate; a drain region of the first conductivity type in the substrate; a gate electrode overlying the substrate between the source region and the drain region; and a core pocket doping region of the second conductivity type within the drain region. The core pocket doping region does not overlap with an edge of the drain region.

3 Claims, 11 Drawing Sheets

ESD PROTECTION DEVICE AND METHOD FOR FABRICATING THE SAME

CROSS REFERENCE TO RELATED APPLICATIONS

This application claims the benefit of U.S. provisional application No. 61/371,001 filed on Aug. 5, 2010.

BACKGROUND OF THE INVENTION

1. Field of the Invention

The present invention relates generally to an electrostatic discharge (ESD) protection device. More particularly, the present invention relates to an ESD protection device with reduced breakdown voltage and method for fabricating the same.

2. Description of the Prior Art

With the continued miniaturization of integrated circuit (IC) devices, the current trend in the sub-micron CMOS technology is to produce integrated circuits with shallower junction depths, thinner gate oxides, lightly-doped drain (LDD) structures, shallow trench isolation structures, and salicide processes. However, the advanced IC devices also become more susceptible to electrostatic discharge (ESD) damage. ESD phenomenon occurs when excess charges are transmitted from the input/output (I/O) pin to the integrated circuit too quickly, which damages the internal circuit. Therefore, ESD protection circuits are built onto the chip to protect the devices and circuits of the IC against ESD damage.

Figure 1:
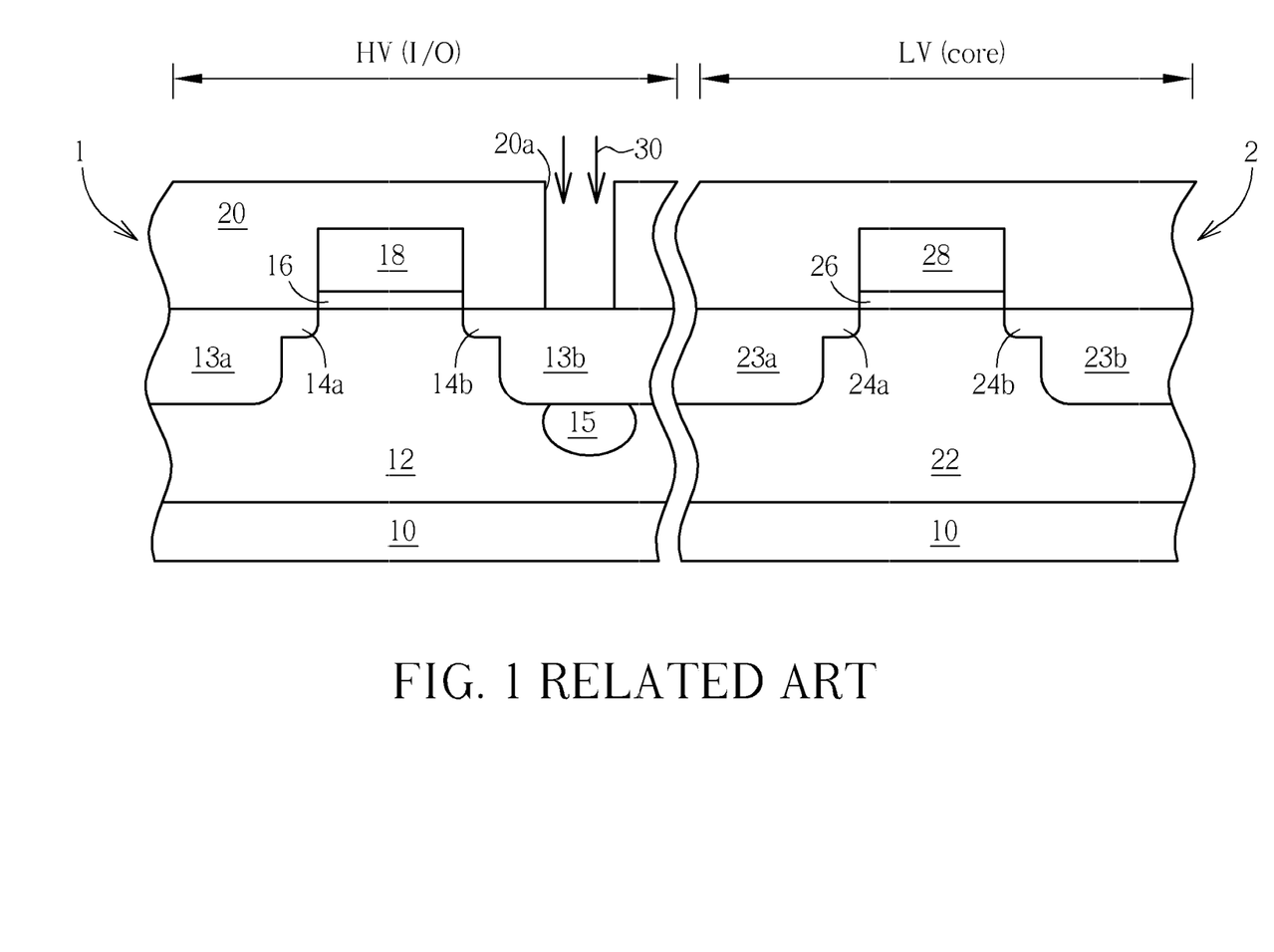
FIG. 1 is a schematic, cross-sectional diagram showing a conventional ESD protection device.

FIG. 1 is a schematic, cross-sectional diagram showing a conventional ESD protection device. As shown in FIG. 1, the ESD protection device 1 is fabricated in an I/O region and may be in the form of an input/output (I/O) NMOS transistor device that receives a relatively higher voltage power ranging between, for example, 3V and 5V. The core device 2, which receives a relatively lower voltage power ranging between, for example, 0.8V and 1.5V, is fabricated within the or core region. The core device 2 includes a source region 23a and a drain region 23b in a well 22. A gate electrode 28 overlies the substrate 10 between the source region 23a and the drain region 23b. An LDD region 24a is provided between the gate electrode 28 and the source region 23a and an LDD region 24b is provided between the gate electrode 28 and the drain region 23b. A gate dielectric layer 26 is interposed between the gate electrode 28 and the substrate 10.

The ESD protection device 1 includes an N⁺ source region 13a and an N⁺ drain region 13b in a P-type well 12. A gate electrode 18 overlies the substrate 10 between the N⁺ source region 13a and the N⁺ drain region 13b. A gate dielectric layer 16 is interposed between the gate electrode 18 and the substrate 10. Typically, an NLDD region 14a is provided between the gate electrode 18 and the N⁺ source region 13a and an NLDD region 14b is provided between the gate electrode 18 and the drain region 13b.

Typically, in order to reduce the drain breakdown voltage (Vbd) of the ESD protection device 1, a P-type ESD implantation process 30 is carried out. During the ESD implantation process, P-type dopants such as boron are implanted into the N⁺ drain region 13b at a doping concentration of, for example, about $5 \times 10^{13}$ atoms/cm² through the opening 20a in the photoresist implant mask 20, thereby forming a P-type ESD doping region 15 with a depth of, for example, approximately 50,000 angstroms. The P-type ESD doping region 15 is located substantially underneath the N⁺ drain region 13b that has a junction depth of about, for example, 30,000 angstroms.

However, the conventional ESD implantation process requires an extra mask (ESD implant mask) to define the opening 20a in the photoresist implant mask 20 and an additional ion implantation step, which increase the manufacture cost and complicate the fabricating process.

SUMMARY OF THE INVENTION

It is one objective of the invention to provide an improved ESD protection device that can spare the conventional ESD implantation process and extra ESD implant mask.

It is another objective of the invention to provide a method for fabricating an ESD protection device without the need of implementing the conventional ESD implantation process. The invention method is compatible with the standard CMOS process and arises no impact on other device's performance such as I/O device or core devices.

To address these and other objects and in view of its purposes, the present invention provides an ESD protection device comprising a substrate; a source region of a first conductivity type in the substrate; a drain region of the first conductivity type in the substrate; a gate electrode overlying the substrate between the source region and the drain region and a core pocket doping region of the second conductivity type. The core pocket doping region does not overlap with an edge of the drain region.

According to one aspect of the invention, an integrated circuit includes a core device in a non input/output (non I/O) region, the core device comprising at least a first core pocket doping region adjacent to at least one of a source region and a drain region of the core device; and an ESD protection device in an I/O region. The ESD protection device comprises a substrate; a source region of a first conductivity type in the substrate; a drain region of the first conductivity type in the substrate; a gate electrode overlying the substrate between the source region and the drain region; and a second core pocket doping region of a second conductivity type. The core pocket doping region does not overlap with an edge of the drain region According to another aspect of the invention, a method for fabricating an ESD protection device includes providing a substrate with an input/output (I/O) region and a non I/O region; forming a gate electrode of a core device overlying the substrate in the non I/O region and a gate electrode of an ESD protection device overlying the substrate in the I/O region; forming a first photoresist film on the substrate, wherein the first photoresist film masks the I/O region while reveals the non I/O region, and wherein the first photoresist film comprises at least an opening positioned adjacent to, immediately or not, the gate electrode of the ESD protection device in the I/O region; and using the first photoresist film as an implant mask, performing a core pocket implantation process to implant dopants of a second conductivity type into the I/O region through the opening and into the non I/O region, thereby forming a core pocket doping region in the I/O region, and core pocket doping regions in the non I/O region.

According to still another aspect of the invention, an ESD protection device includes a substrate; a first well of a first conductivity type in the substrate; a source region of a second conductivity type in the first well; a drain region of the second conductivity type in the first well; a gate electrode overlying the substrate between the source region and the drain region; a second well of the second conductivity type, wherein the second well is positioned between the gate electrode and the drain region; and a well portion of the first well situated between the second well and an edge of an isolation region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. The terms wafer and substrate used herein include any structure having an exposed surface onto which a layer is deposited according to the present invention, for example, to form the integrated circuit (IC) structure.

The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term "horizontal" as used herein is defined as a plane parallel to the conventional major plane or surface of the semiconductor chip or die substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Figure 2A:
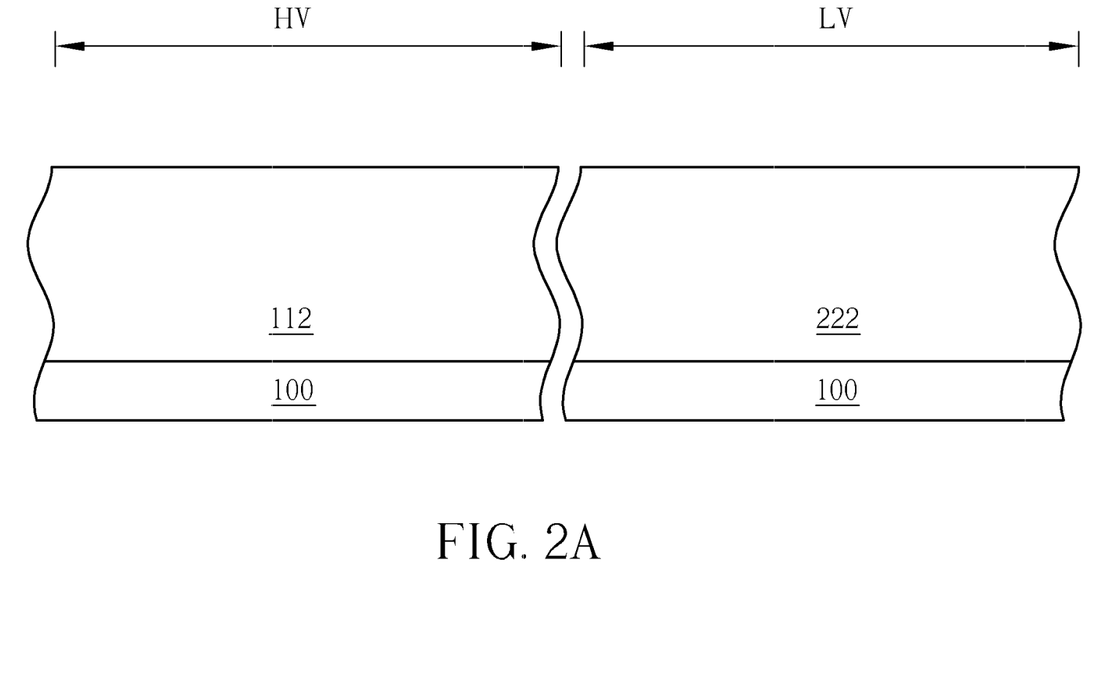
FIG. 2A to FIG. 2F are schematic, cross-sectional diagrams showing an exemplary method for fabricating an ESD protection device in accordance with one embodiment of this invention.

FIG. 2A to FIG. 2F are schematic, cross-sectional diagrams showing an exemplary method for fabricating an electrostatic discharge (ESD) protection device in accordance with one embodiment of this invention. First, as shown in FIG. 2A, a substrate 100 is provided. The substrate 100 may be a semiconductor substrate such as silicon substrate, epitaxial substrate, silicon-on-insulator (SOI) substrate, SiGe substrate or the like. The substrate 100 includes at least an input/output (I/O) region such as a high-voltage (HV) region and a non I/O region such as a low-voltage (LV) region. An input/output region of a circuit or a semiconductor chip can mean, but is not limited to, a region capable of transferring signal between the circuit or the semiconductor chip and the circuit or the semiconductor chip outside it. For example, a signal from another circuit or semiconductor chip can be input into this circuit or semiconductor chip, and a signal generated by this circuit or semiconductor chip can be output from this circuit or semiconductor chip to another circuit or semiconductor chip. Non I/O region can mean, but is not limited to, a region of the circuit or semiconductor chip that is not the I/O region. In some embodiments, the non I/O region includes the core region. A well 112, such as a P-type well, is formed in the substrate 100 within the I/O region and a well 222, such as a P type well, is formed in the substrate 100 within the non I/O region. The ESD protection device can be formed within the I/O region. The core device can be formed within the non I/O region. However, it is to be understood that the ESD protection device is not necessary to operate with high voltage. In some embodiments, the ESD protection device may operate with low voltage. It is understood that the HV and LV regions are for illustration purposes only. The isolation region, such as shallow trench isolation (STI), is not shown in the figures for the sake of simplicity.

According to the embodiment of this invention, the ESD protection device may be in the form of an input/output (I/O) NMOS transistor device that may receive a relatively higher voltage power ranging between 3V and 5V, while the core device may receive a relatively lower voltage power ranging between 0.8V and 1.5V. It is to be understood that the ESD protection device may be a PMOS device in another embodiment of the invention. It should be recognized that although the present invention has been illustrated schematically with the use of certain conductivity types, the opposite conductive types can also be implemented in order to form PMOS or HVPMOS.

Figure 2B:
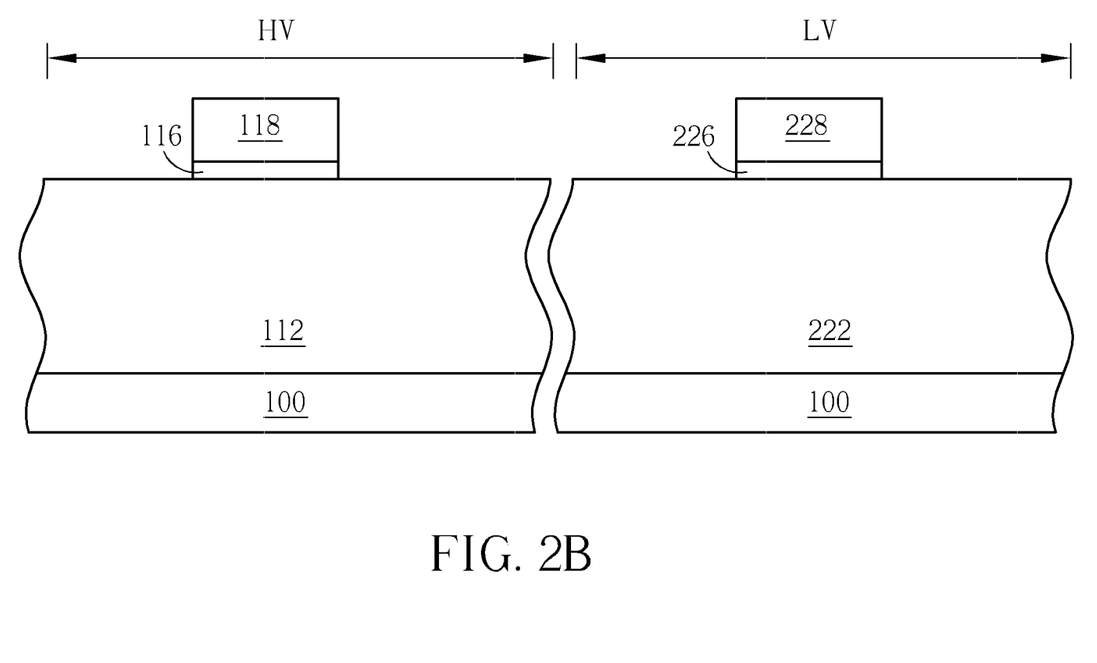

As shown in FIG. 2B, a gate electrode 118 and a gate electrode 228 can be formed overlying the substrate 100 within the I/O region and the non I/O region respectively. A gate dielectric layer 116 can be provided between the gate electrode 118 and the substrate 100. A gate dielectric layer 226 can be provided between the gate electrode 228 and the substrate 100. According to the embodiment of the invention, the gate electrode 118 and the gate electrode 228 may be composed of polysilicon, doped polysilicon, metal or a combination thereof. According to the embodiment of the invention, the gate dielectric layer 116 and the gate dielectric layer 226 may be formed by oxidation or deposition methods. For example, the gate dielectric layer 116 and the gate dielectric layer 226 may be composed of thermal silicon oxide.

Figure 2C:
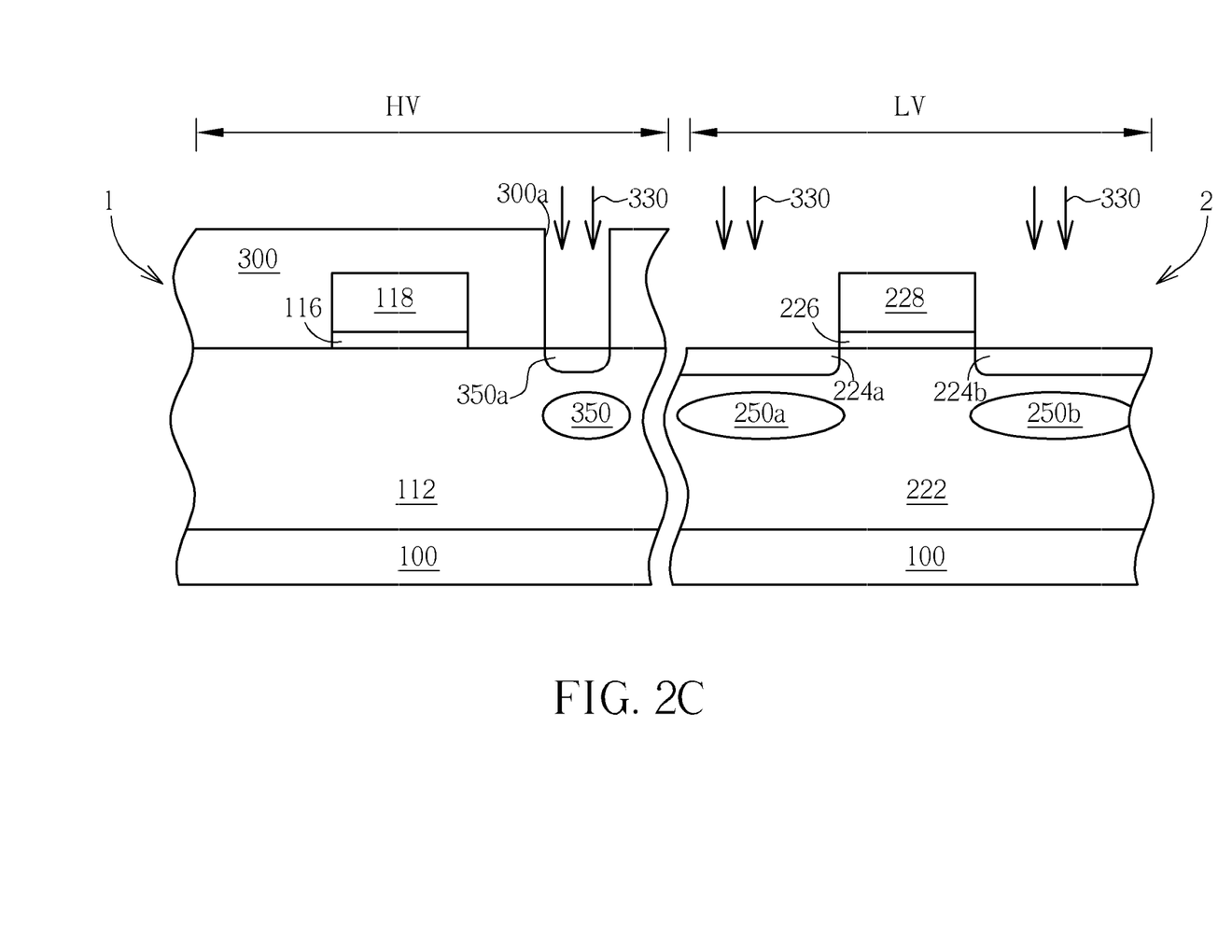

As shown in FIG. 2C, a photoresist film 300 can be formed on the substrate 100. The photoresist film 300 masks the I/O region while reveals the non I/O region. An opening 300a can be provided in the photoresist film 300 within the I/O region. The opening 300a can be adjacent to the gate electrode 118 and is within a drain region to be formed next to the gate electrode 118. Though the opening 300a is not immediately adjacent to the gate electrode 118 in this embodiment, the opening can also be immediately adjacent to the gate electrode. Subsequently, an non I/O LDD or core LDD implantation process can be carried out to implant dopants such as N-type dopant arsenic at a doping concentration between, for example, $1\times10^{15}$-$3\times10^{15}$ atoms/cm$^2$ into the well 112 through the opening 300a and into the well 222, thereby forming core LDD regions 224a and 224b in the well 222 and a lightly doped region 350a in the well 112. According to the embodiment of the invention, the depth of the core LDD regions 224a and 224b and the depth of the lightly doped region 350a may be between, for example, 5,000-7,000 angstroms below the main surface of the substrate 100. However, it is understood that other depth and doping concentration may be applicable depending on the design requirements or the generation of the device.

Using the same photoresist film 300 as an implant mask, a core pocket implantation process 330 can then be carried out to implant dopants such as P-type dopant BF$_2$ at a doping concentration substantially between, for example, $4\times10^{13}$ and $8\times10^{13}$ atoms/cm$^2$, into the well 112 through the opening 300a and into the well 222, thereby forming core pocket doping regions 250a and 250b in the well 222 and a core pocket doping region 350 in the well 112. The core pocket doping region 250a in this embodiment is located under the core LDD region 224a. The core pocket doping region 250b in this embodiment is located under the core LDD region 224b. The core pocket doping region 350 in this embodiment is located under the lightly doped region 350a. According to the embodiment of the invention, the depth of the core pocket doping regions 250a and 250b and the depth of the core pocket doping region 350 may be substantially between, for example, 10,000 and 50,000 angstroms, below the main surface of the substrate 100. According to the embodiment of the invention, the core pocket doping regions 250a and 250b and the core pocket doping region 350 have substantially the same depth and substantially the same doping concentration since they are all formed by using the same core pocket implantation process 330.

Figure 2D:
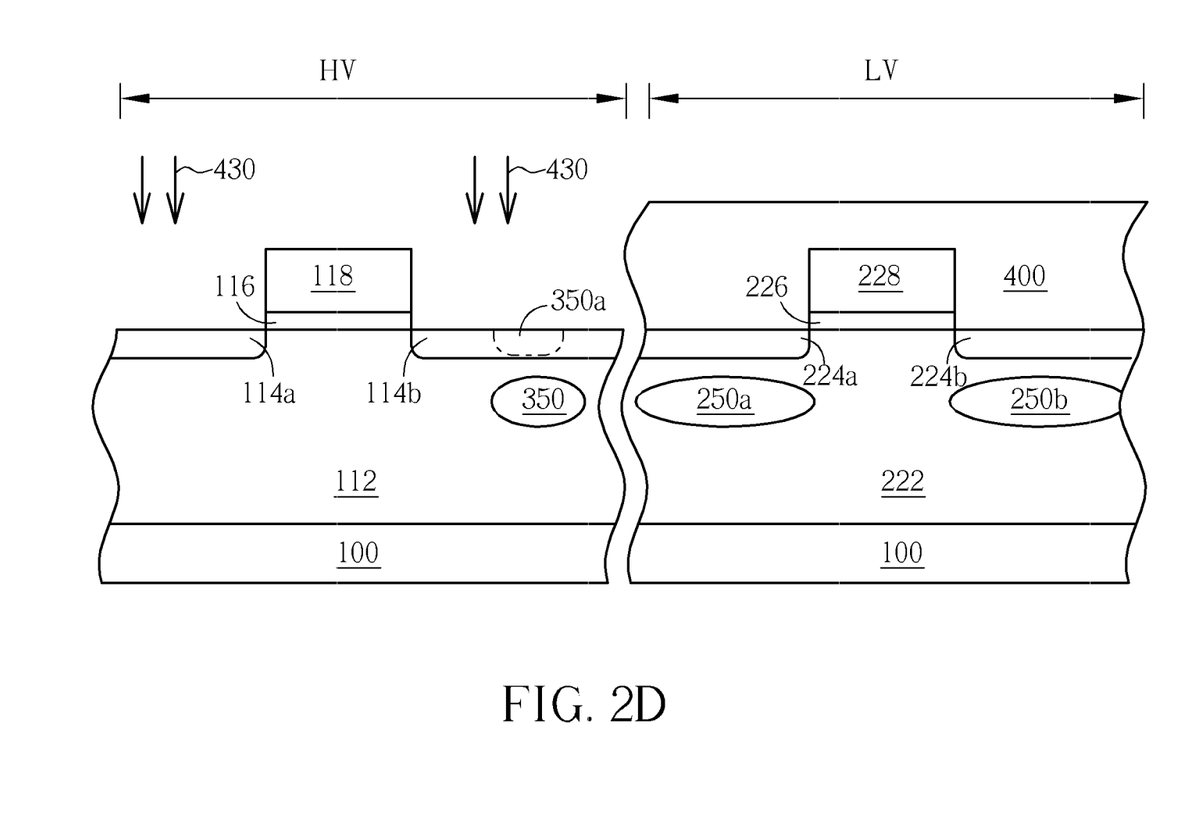

As shown in FIG. 2D, after the core pocket implantation process 330 is performed, the photoresist film 300 can be stripped. A photoresist film 400 can then be formed on the substrate 100. The photoresist film 400 masks the non I/O region while reveals the I/O region. Thereafter, an I/O LDD implantation process 430 can be carried out to implant dopants such as N-type dopants arsenic into the well 112, thereby forming LDD regions 114a and 114b in the well 112. It is to be understood that the implantation steps shown in FIG. 2C and FIG. 2D are interchangeable. For example, the LDD regions 114a and 114b may be formed prior to the formation of the core LDD regions 224a and 224b.

Figure 2E:
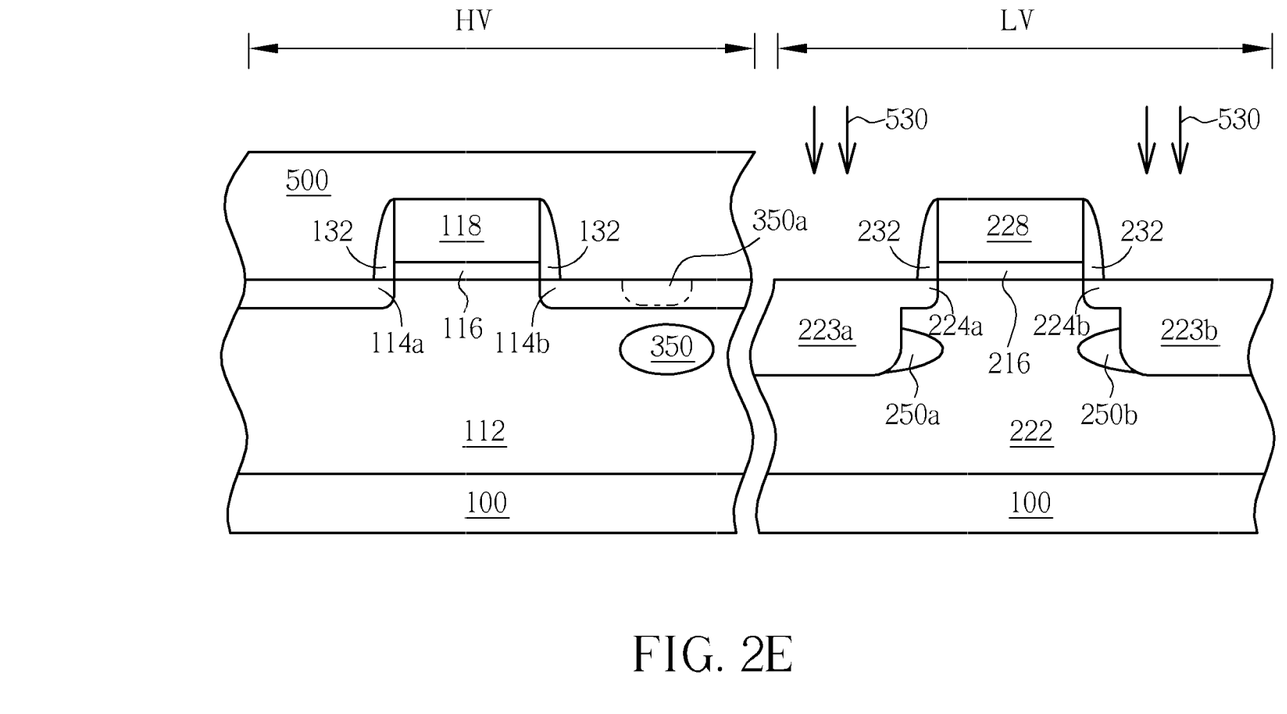

As shown in FIG. 2E, after the I/O LDD implantation process 430 is performed, the photoresist film 400 can be stripped. A pair of sidewall spacers 132 can be formed on the sidewalls of the gate electrode 118 and a pair of sidewall spacers 232 can be formed on the sidewalls of the gate electrode 228. After the formation of the sidewall spacers, a photoresist film 500 can then be formed on the substrate 100. The photoresist film 500 masks the I/O region while reveals the non I/O region. A non I/O source/drain implantation process 530 can be carried out to implant dopants such as N-type dopant phosphorus into the well 222, thereby forming source region 223a and drain region 223b. According to this embodiment, the source region 223a and drain region 223b are both heavily doped and have a doping concentration that is greater than that of the core LDD regions 224a and 224b.

Figure 2F:
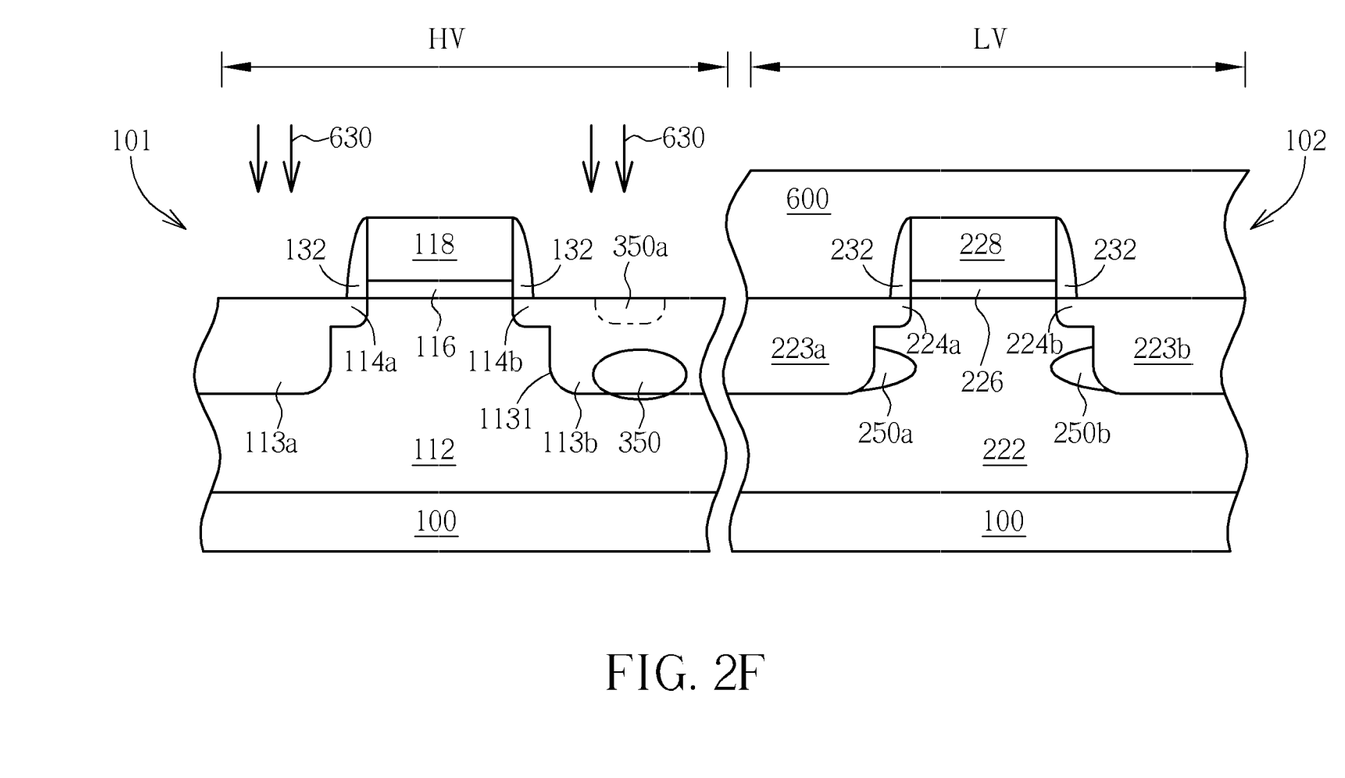

As shown in FIG. 2F, after the non I/O source/drain implantation process 530 is performed, the photoresist film 500 can be stripped. A photoresist film 600 can then be formed on the substrate 100. The photoresist film 600 masks the non I/O region while reveals the I/O region. An I/O source/drain implantation process 630 can be carried out to implant dopants such as N-type dopant phosphorus into the well 112, thereby forming source region 113a and drain region 113b. The photoresist film 600 can then be stripped. According to this embodiment, the source region 113a and drain region 113b are both heavily doped and have a doping concentration that is greater than that of the LDD regions 114a and 114b.

The present invention has been particularly shown and described with respect to certain embodiment and specific features thereof. The embodiment set forth herein as set forth through FIGS. 2A-2F is to be taken as illustrative rather than limiting. It should be readily apparent to those of ordinary skill in the art that various changes and modifications in form and detail may be made without departing from the spirit and scope of the invention. For example, the process sequence in FIGS. 2A-2F may be changed or some process steps may be omitted in other embodiments.

One feature of the invention method described above is that the ESD protection device 101 is compatible with current processes such as CMOS processes and can spare an extra mask for ESD implant. That is, the conventional ESD implantation process and the related mask for defining ESD implant opening can be omitted according to this invention. Instead, the core pocket implantation process, which is used to form core pocket regions in the core device, is introduced. Therefore, the manufacture cost can be reduced without affecting the HVMOS performance.

Structurally, referring to FIG. 2F, the ESD protection device 101 in the I/O region includes a source region 113a such as an N$^+$ source region in a well 112 such as a P-type well, a drain region 113b such as an N$^+$ drain region in the well 112, an LDD region (source LDD) 114a merged with the source region 113a, an LDD region (drain LDD) 114b merged with the drain region 113b, a gate electrode 118 overlying the substrate 100 between the LDD regions 114a and 114b, a gate dielectric layer 116 between the gate electrode 118 and the substrate 100, a pair of sidewall spacers 132 on the sidewalls of the gate electrode 118, and a core pocket doping region 350 overlapping with the drain region 113b. According to the embodiment, the core pocket doping region 350 does not overlap with an edge of the drain region 113b, for example, the edge 1131 of the drain region 113b that is near the gate electrode 118. The core pocket doping region 350 can be formed concurrently with the core pocket doping regions 250a and 250b of the core device 102 in the non I/O region. Therefore, the core pocket doping regions 250a and 250b and the core pocket doping region 350 can have substantially the same depth and doping concentration. In this embodiment, the core pocket doping regions 250a and 250b of the core device 102 may be located at the edges of the source region 223a and drain region 223b that are near the gate electrode 228, while the core pocket doping region 350 for the ESD protection device 101 may be located at the bulk of the drain region 113b and does not overlap with the edge 1131 of the drain region 113b that is near the gate electrode 118. The core pocket doping region 350 can help reduce the breakdown voltage, thereby improving the ESD protection performance.

Figure 3A:
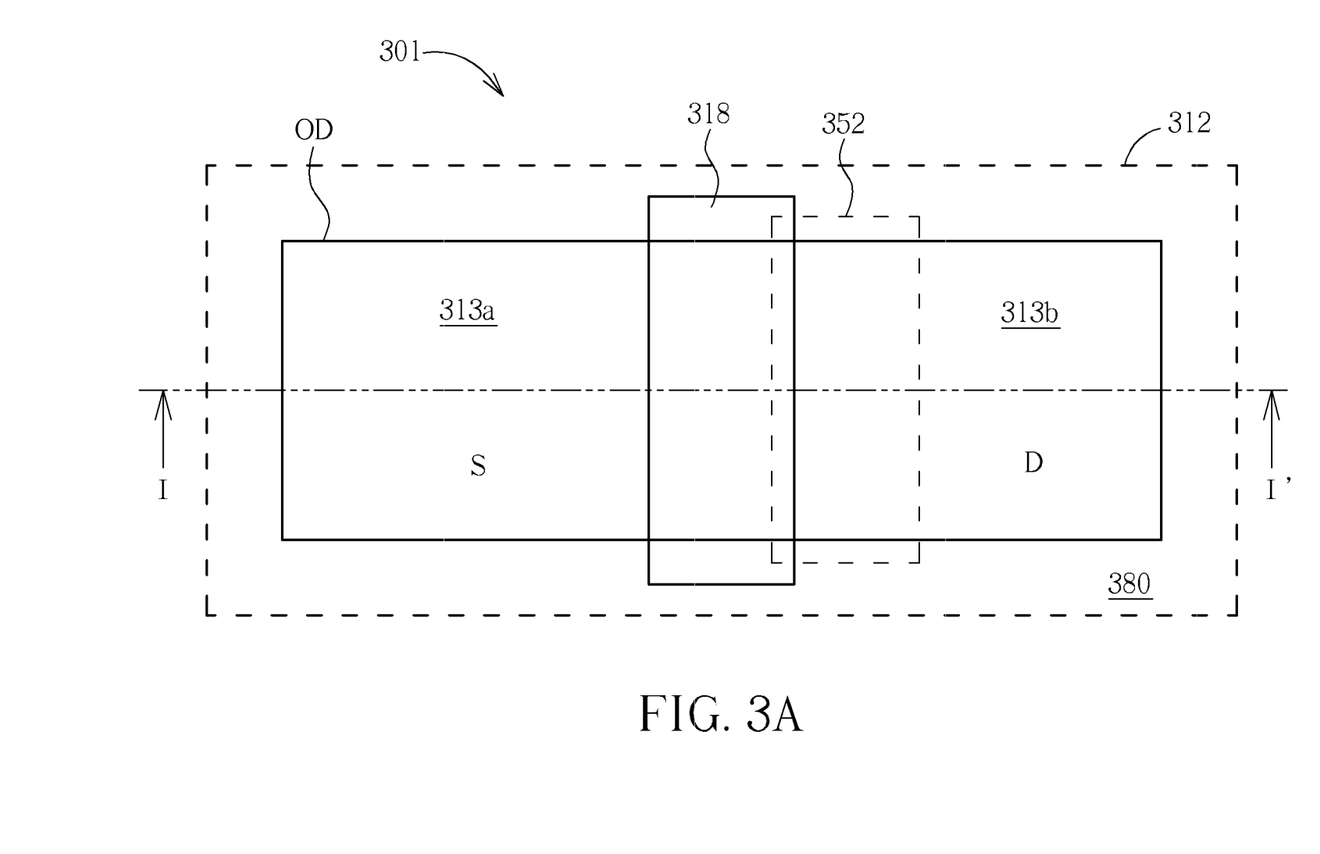
FIG. 3A is a schematic layout diagram showing an ESD protection HVMOS device in accordance with another embodiment of the invention.
Figure 3B:
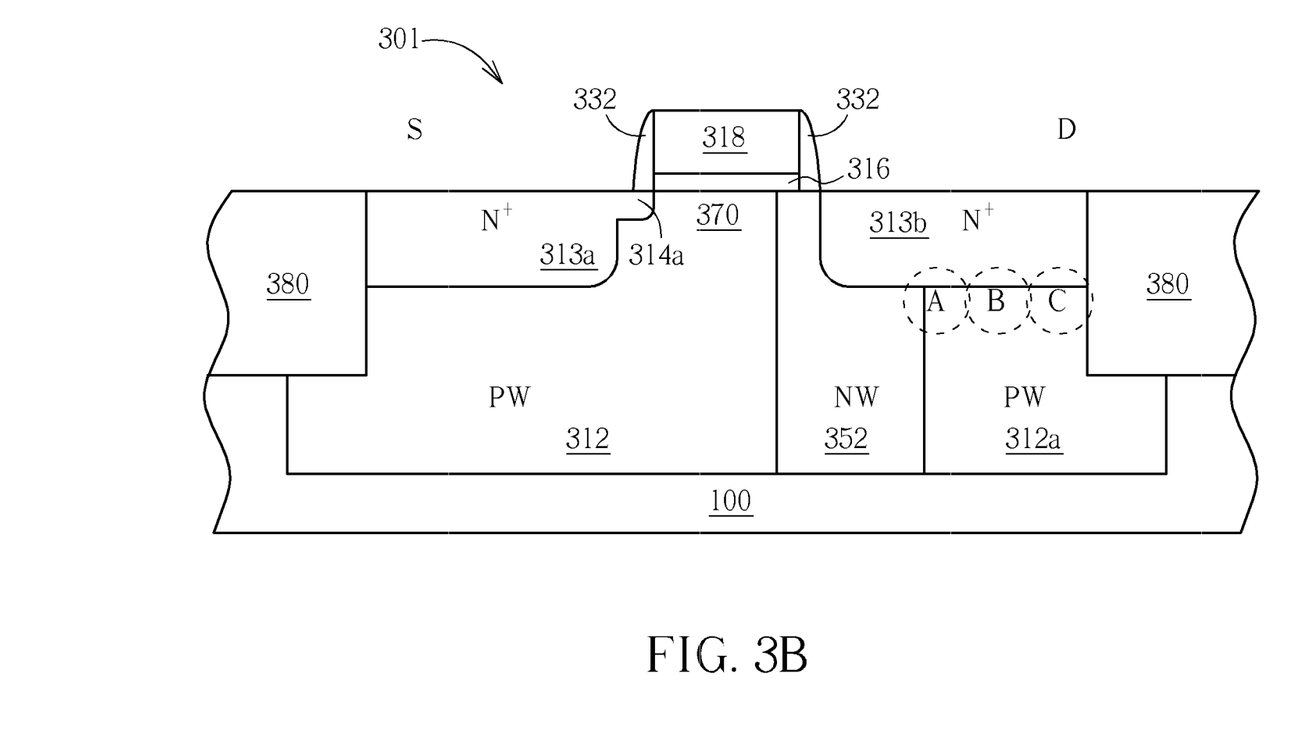
FIG. 3B is a schematic, cross-sectional diagram taken along line I-I' of FIG. 3A.

Please refer to FIG. 3A and FIG. 3B. FIG. 3A is a schematic layout diagram showing an ESD protection HVMOS device in accordance with another embodiment of the invention. FIG. 3B is a schematic, cross-sectional diagram taken along line I-I' of FIG. 3A. As shown in FIG. 3A and FIG. 3B, the ESD protection HVMOS device 301 can be fabricated in a substrate 100 such as a P-type silicon substrate. More specifically, the ESD protection HVMOS device 301 can be fabricated in an oxide define (OD) area that is surrounded by an isolation region, such as shallow trench isolation (STI) region, 380. The ESD protection HVMOS device 301 includes a source region 313a such as an N+ source region in a well 312 such as a P-type well, an LDD region 314a merged with the source region 313a, a drain region 313b such as an N+ drain region that is positioned apart from the source region 313a, a gate electrode 318 between the source region 313a and the drain region 313b, a gate dielectric layer 316 between the gate electrode 318 and the substrate 100, a pair of spacers 332 on the sidewalls of the gate electrode 318, a well 352 such as an N-type well positioned between the gate electrode 318 and the drain region 313b and may partially overlap with the drain region 313b and may extend to an area directly underneath the gate electrode 318, a well portion 312a of the well 312 situated between the well 352 and the edge of the isolation region 380, and a channel region 370 between the LDD region 314a and the well 352.

According to the embodiment of the invention, the well 352 acting an extended drain region, which increases sustained voltage of the ESD protection HVMOS device 301, does not completely encompass the drain region 313b so as to reveal the well portion 312a of the well 312 underneath the drain region 313b. It is advantageous to use the ESD protection HVMOS device 301 as an embedded ESD protection device in the integrated circuits because the revealed well portion 312a of the well 312 is capable of reducing junction breakdown voltage of the ESD protection HVMOS device 301 by way of the three regions: A, B and C in FIG. 3B, which are indicated by dashed lines respectively. The region A encompasses an NP junction between the N+ drain region 313b plus N-type well 352 and the well portion 312a of the P-type well 312 (N++NW/PW junction). The region B encompasses an NP junction between the N+ drain region 313b and the well portion 312a of the P-type well 312 (N+/PW junction). The region C encompasses an NP junction between the N+ drain region 313b and the well portion 312a of the P-type well 312 at the edge of the isolation region 380. The proposed ESD protection HVMOS device can have reduced breakdown voltage and thus increased ESD performance.

Figure 4:
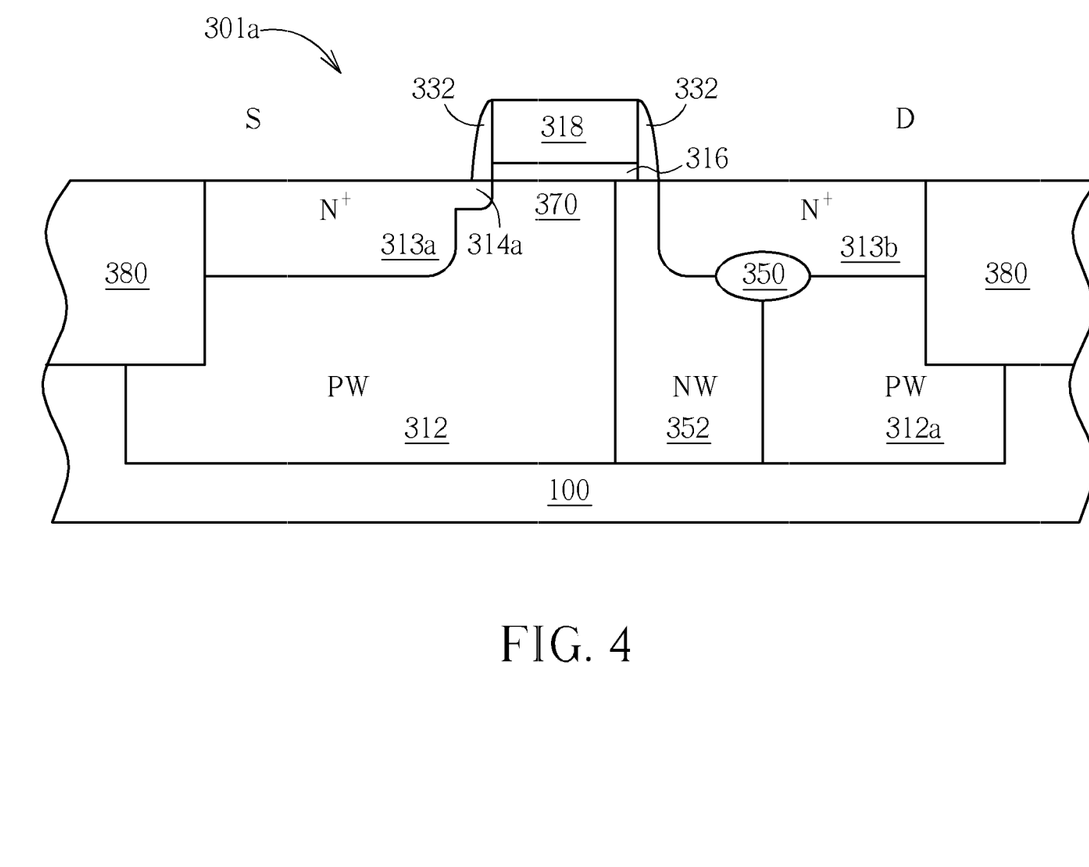
FIG. 4 is a schematic, cross-sectional diagram showing an ESD protection HVMOS device in accordance with still another embodiment of the invention.

FIG. 4 is a schematic, cross-sectional diagram showing an ESD protection HVMOS device in accordance with still another embodiment of the invention, wherein like numeral numbers designate like regions, layers or elements. As shown in FIG. 4, the ESD protection HVMOS device 301a can be fabricated in a substrate 100 such as a P-type silicon substrate. Likewise, the ESD protection HVMOS device 301a includes a source region 313a such as an N+ source region in a well 312 such as a P-type well, an LDD region 314a merged with the source region 313a, a drain region 313b such as an N+ drain region that is positioned apart from the source region 313a, a gate electrode 318 between the source region 313a and the drain region 313b, a gate dielectric layer 316 between the gate electrode 318 and the substrate 100, a pair of spacers 332 on the sidewalls of the gate electrode 318, a well 352 such as an N-type well positioned between the gate electrode 318 and the drain region 313b and may partially overlap with the drain region 313b and may extend to an area directly underneath the gate electrode 318, a well portion 312a of the well 312 situated between the well 352 and the edge of the isolation region 380, and a channel region 370 between the LDD region 314a and the well 352. The well 352 acting an extended drain region, which increases sustained voltage of the ESD protection HVMOS device 301a, does not completely encompass the drain region 313b so as to reveal the well portion 312a of the well 312 underneath the drain region 313b.

The difference between the ESD protection HVMOS device 301 in FIG. 3B and the ESD protection HVMOS device 301a in FIG. 4 is that the ESD protection HVMOS device 301a includes a core pocket doping region 350 that is located within the region A as set forth in FIG. 3B. According to the embodiment of the invention, the core pocket doping region 350 is a P-type doping region and can be implanted into the N+ drain region 313b using the steps similar to that as set forth through FIGS. 2C-2F. That is, the core pocket doping region 350 can be formed concurrently with the core pocket doping regions of the core devices. Therefore, the core pocket doping regions 350 may have substantially the same depth and doping concentration as that of the core devices in the non I/O region. The core pocket doping region 350 can further reduce the breakdown voltage and increase ESD performance.

Figure 5:
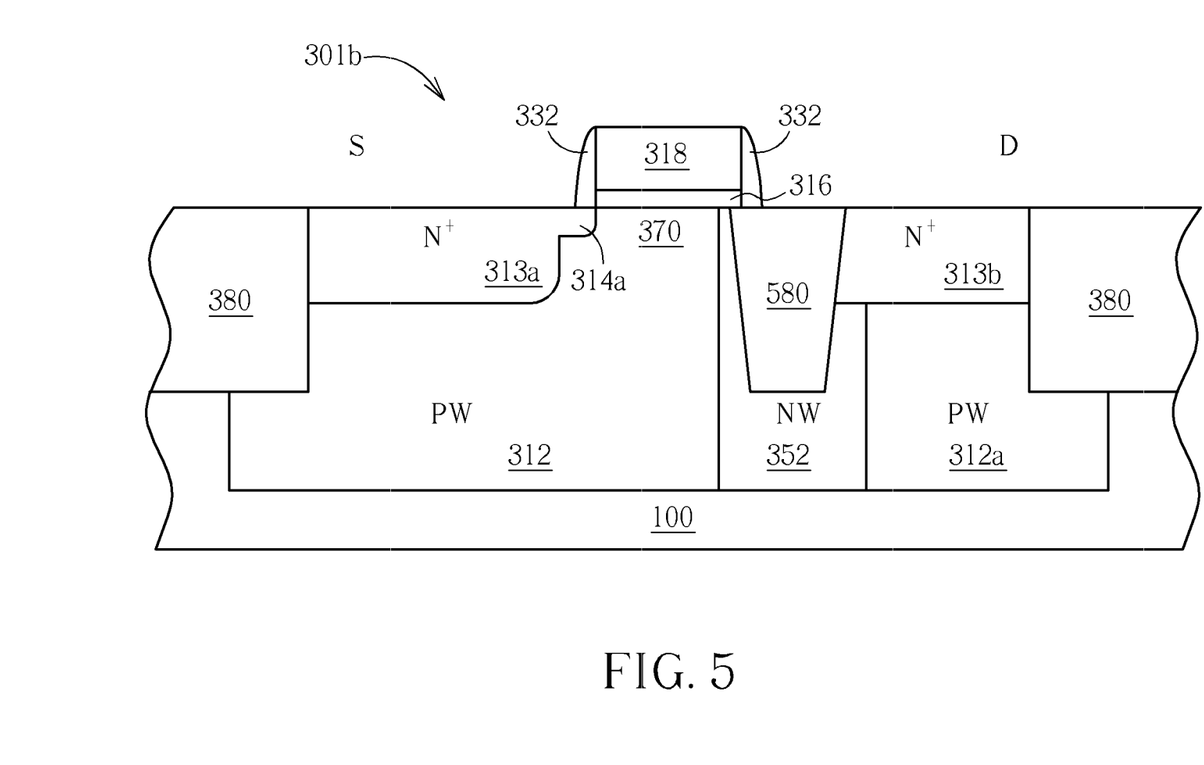
FIG. 5 is a schematic, cross-sectional diagram showing an ESD protection HVMOS device in accordance with yet another embodiment of the invention.

FIG. 5 is a schematic, cross-sectional diagram showing an ESD protection HVMOS device in accordance with yet another embodiment of the invention. With the incorporation of the isolation structure, such as STI, at the drain side, the ESD protection HVMOS device 301b in FIG. 5 can sustain higher voltage, for example, 8-10V. As shown in FIG. 5, the ESD protection HVMOS device 301b can be fabricated in a substrate 100 such as a P-type silicon substrate. Likewise, the ESD protection HVMOS device 301b includes a source region 313a such as an N+ source region in a well 312 such as a P-type well, an LDD region 314a merged with the source region 313a, a drain region 313b such as an N+ drain region that is positioned apart from the source region 313a, a gate electrode 318 between the source region 313a and the drain region 313b, a gate dielectric layer 316 between the gate electrode 318 and the substrate 100, a pair of spacers 332 on the sidewalls of the gate electrode 318, a well 352 such as an N-type well positioned between the gate electrode 318 and the drain region 313b and may partially overlap with the drain region 313b and may extend to an area directly underneath the gate electrode 318, an isolation structure, such as STI structure, 580 in the well 352 between the gate electrode 318 and the drain region 313b, a well portion 312a of the well 312 situated between well 352 and the edge of a isolation region 380, and a channel region 370 between the LDD region 314a and the well 352. The N-type well 352 acting an extended drain region, which increases sustained voltage of the ESD protection HVMOS device 301b, does not completely encompass the drain region 313b so as to reveal the well portion 312a of the well 312 underneath the drain region 313b. The isolation structure 580 help the ESD protection HVMOS device 301b sustain higher voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An ESD protection device, comprising:
a substrate;
a first well of a first conductivity type in the substrate;
a source region of a second conductivity type in the first well;
a drain region of the second conductivity type;
a gate electrode overlying the substrate between the source region and the drain region;

a second well of the second conductivity type, wherein the second well is positioned between the gate electrode and the drain region and the second well encompasses a first part of the drain region; and a portion of the first well situated between the second well and an edge of an isolation region and encompasses a second part of the drain region;

wherein an isolation structure is positioned in the second well between the gate electrode and the drain region.

2. The ESD protection device according to claim 1 wherein the second well of the second conductivity type acts as an extended drain region.

3. The ESD protection device according to claim 1 further comprising a core pocket doping region of the first conductivity type overlapping with the drain region.

* * * * *